United States Patent [19]
Rezzi et al.

[11] Patent Number: 5,576,646
[45] Date of Patent: Nov. 19, 1996

[54] TRANSCONDUCTOR CIRCUIT WITH HIGH-LINEARITY DOUBLE INPUT AND ACTIVE FILTER THEREOF

[75] Inventors: Francesco Rezzi, Pavia; Andrea Baschirotto, Tortona; Rinaldo Castello, Arcore, all of Italy

[73] Assignee: SGS-Thomson Microelectronics, S.r.l., Agrate Brianza, Italy

[21] Appl. No.: 473,533

[22] Filed: Jun. 7, 1995

[30] Foreign Application Priority Data

Jun. 30, 1994 [EP] European Pat. Off. ............ 94830324

[51] Int. Cl.$^6$ ............................ H03K 5/22; H03K 17/60
[52] U.S. Cl. ............................ 327/103; 327/63; 327/433; 327/552
[58] Field of Search ............................ 327/63, 65, 67, 327/70, 103, 379, 384, 383, 433, 560, 561, 562, 563, 551, 552, 553, 557, 558, 559; 330/252, 253, 261, 277

[56] References Cited

U.S. PATENT DOCUMENTS

| 4,563,653 | 1/1986 | Perahia | 330/255 |
|---|---|---|---|
| 4,723,110 | 2/1988 | Voorman | 330/252 |
| 4,897,611 | 1/1990 | Laber et al. | 330/253 |
| 5,128,630 | 7/1992 | Mijuskovic | 330/253 |
| 5,332,937 | 7/1994 | Castello et al. | 327/552 |

FOREIGN PATENT DOCUMENTS 2175763 12/1986 United Kingdom .

OTHER PUBLICATIONS

H. Wallinga et al., "Design and Analysis of CMOS Analog Signal Processing Circuits by Means of a Graphical MOST Model." IEEE Journal of Solid-State Circuits, vol. 24, No. 3, p. 672 (1989).

D. Y. Kim et al., "The Design and Comparison of Elliptic Filters with an OTA-C Structure," Proceedings of the 33rd Midwest Symposium on Circuits and Systems, p. 484 (1990).

Silva-Martinez et al, "A Large-signal very low-distortion transconductor for high frequency continuous-time filters," IEEE Journal of Solid-State Circuits vol. 26, No. 7 pp. 946–955 (Jul. 1991).

Tanimoto et al., "Realization of I–V active filter using a linearization technique employing plurality of emitter--coupled pairs," 26 IEEE Journal of Solid-State Circuits vol. 26, No. 7 pp. 937–945 (Jul. 1991).

Castello et al., "A very linear BICMOS transconductor for high-frequency filtering applications.," in the 1990 IEEE International Symposium on Circuits and Systems vol. 2, pp. 1364–1367.

Perry, "A flexible transconductor-capacitor filter demonstrator," in the 1989 IIEEE International Symposium on Circuits and Systems vol. 2, pp. 1075–1078.

(List continued on next page.)

Primary Examiner—Toan Tran
Attorney, Agent, or Firm—Robert Groover; Betty Formby

[57] ABSTRACT

The invention relates to a transconductor circuit with a double input and a single output, comprising two input transistors (M1, M2) whose primary conduction terminals (D1, S1, D2, S2) are respectively connected together; in this way, variations in load current and voltage can be made lower, thereby also lowering distortion from changes in their transconductance.

28 Claims, 2 Drawing Sheets

OTHER PUBLICATIONS

Haigh et al, "Continuous-time and switched capacitor monolithic filters based on current and change simulation" 137 IEE Proceedings G (Circuits, Devices and Systems) 147 (1990).

DeHey et al., "Transconductor and integrator circuits for integrated bipolar video frequency filters," 1989 IEEE Int'l Symposium on Circuits and Systems vol. 1 pp. 114–117.

Perry, "An integrated continuous-time bipolar transconductor-capacitor filter", 24 IEEE Journal of Solid-State Circuits 732 (1989).

Nedungodi et al., "High frequency voltage-controlled continuous-time lowpass filter using linearised CMOS integrators", 22 Electronics Letters 729 (1986).

Czarnul et al., "MOS tunable transconductor," 22 Electronics Letters p. 721 (1986).

Wang and Guggenbuehl, "A voltage-controllable linear MOS transconductor using bias offset technique" 25 IEEE Journal of Solid-State Circuits 315 (1990).

Van de Plassche, "A wide-band monolithic instrumentation amplifier", 10 IEEE Journal of Solid-State Circuits 424 (1975).

Pookayaudom and Surakampontoen, "An integratable precision voltage-to-current convertor with bilateral capability," 13 IEEE Journal of Solid-State Circuits (Jun. 1978).

Blauscheld "An open loop programmable amplifier with extended frequency range", 16 IEEE Journal of Solid-State Circuits 626 (1981).

TRANSCONDUCTOR CIRCUIT WITH HIGH-LINEARITY DOUBLE INPUT AND ACTIVE FILTER THEREOF

CROSS-REFERENCE TO RELATED APPLICATION

This application claims priority from EPC App'n 94830324.3, filed 06/30/94, which is hereby incorporated by reference. However, the content of the present application is not necessarily identical to that of the priority application.

BACKGROUND AND SUMMARY OF THE INVENTION

This invention relates to double-input transconductor circuits, and to active filters which incorporate them.

A transconductor is a voltage-controlled variable-transconductance stage, and is an integral part of the operational transconductance amplifier ("OTA") which is a voltage-controlled current-source amplifier. A well-known desideratum of transconductor circuits is linearity. Transconductors are used in active filters, and also in gyrators, oscillators, and circuits for impedance transformation. See generally J.Scott, ANALOG ELECTRONIC DESIGN (1991), which is hereby incorporated by reference. Some specific examples of the literature on transconductor designs, and their application to con- tinuous-time filters, includes the following, all of which are hereby incorporated by reference: Silva-Martinez et al., "A large-signal very low-distortion transconductor for high-frequency continuous-time filters," IEEE JOURNAL OF SOLID-STATE CIRCUITS vol.26, no.7 p.946–55 (July 1991); Tanimoto et al., "Realization of a 1-V active filter using a linearization technique employing plurality of emitter-coupled pairs," 26 IEEE JOURNAL OF SOLID-STATE CIRCUITS vol.26, no.7 p.937–45 (July 1991); Castello et al., "A very linear BiCMOS transconductor for high-frequency filtering applications," in the 1990 IEEE INTERNATIONAL SYMPOSIUM ON CIRCUITS AND SYSTEMS vol.2, pp. 1364–7; Perry, "A flexible transconductor-capacitor filter demonstrator," in the 1989 IEEE INTERNATIONAL SYMPOSIUM ON CIRCUITS AND SYSTEMS vol.2, p.1075–8; Haigh et at., "Continuous-time and switched capacitor monolithic filters based on current and charge simulation," 137 IEE PROCEEDINGS G (Circuits, Devices and Systems) 147 (1990); de Heij et at., "Transconductor and integrator circuits for integrated bipolar video frequency filters," 1989 IEEE INTERNATIONAL SYMPOSIUM ON CIRCUITS AND SYSTEMS vol. 1 p. 114–17; Perry, "An integrated continuous-time bipolar transconductor-capacitor filter," 24 IEEE JOURNAL OF SOLID-STATE CIRCUITS 732 (1989); Nedungadi et al., "High-frequency voltage-controlled con- tinuous-time lowpass filter using linearised CMOS integrators," 22 ELECTRONICS LETTERS 729 (1986); Czarnul et al., "MOS tunable transconductor," 22 ELECTRONICS LETTERS p. 721 (1986); Wang and Guggenbuehl, "A voltage-controllable linear MOS transconductor using bias offset technique," 25 IEEE JOURNAL OF SOLID-STATE CIRCUITS 315 (1990); Van de Plassche, "A wide-band monolithic instrumentation amplifier," 10 IEEE JOURNAL OF SOLID-STATE CIRCUITS 424 (1975); Pookaiyaudom and Surakampontorn, "An integratable precision voltage-to-current converter with bilateral capability, "13 IEEE JOURNAL OF SOLID-STATE CIRCUITS (June 1978); Blauschild, "An open loop programmable amplifier with extended frequency range", 16 IEEE JOURNAL OF SOLID-STATE CIRCUITS 626 (1981); all of which are hereby incorporated by reference.

Patent Application GB-A-2 175763, which is hereby incorporated by reference, addresses (inter alia) the need for linearity, and proposes as a preferred embodiment the half-circuit shown in FIG. 1. This comprises a MOS transistor denoted by M which has its source terminal connected to a reference potential GND (usually ground) and its gate terminal connected to the circuit input; and a bipolar transistor having an emitter terminal connected to the drain terminal of the transistor M and a base terminal connected to a reference bias potential UDC; a bias current IDC flows through the collector of transistor Q.

The transconductance G of the circuit is given by $$G = K*H*V_{DS},$$

where $V_{DS}$ is the drain-to-source voltage of the transistor M, K is a coefficient dependent on the manufacturing process used for the transistor M and on the gate-to-source voltage $V_{GS}$, and H is a coefficient dependent on the geometry of transistor M. Note that the drain-source voltage $V_{DS}$ can be expressed as $$V_{DS} = UDC - Vbe.$$

The base-emitter voltage Vbe is dependent on the current being passed by the bipolar, according to the well-known relation $$V_{be} = V_t \ln \frac{I}{I_{so}}.$$

In order to limit the distortion due to the coefficient K, the aforementioned application proposes the use of differential circuits formed of fully symmetrical half-circuits.

To limit the distortion due to the presence of the term $V_{DS}$, the aforementioned Application proposes, as a preferred embodiment, that the transistor Q be used to lower the output impedance as seen from the transistor M on the drain terminal, as shown in the half-circuit of FIG. 1; in fact, when the voltage $V_{GS}$ of transistor M varies, its (output) drain current also varies, and consequently, so does the (output) voltage on the load applied to the drain terminal, which corresponds to the term $V_{DS}$. As second choice, the aforementioned Application proposes that the transistor Q can be replaced with an output stage consisting of a feedback connected circuit which has a much lower input impedance and much higher output impedance.

Such an output stage necessarily requires a fairly complicated circuit implementation, and becomes even more complicated where several transconductor circuits must be used, as is the case with active filters, and especially if they are to be integrated to a chip. The feedback scheme, moreover, restricts the structure utility range by placing limits on its frequency.

It is an object of this invention to provide a circuit with improved linearity, which is particularly beneficial in high-frequency active filters.

By using a two-input transconductor wherein the two input transistors have output terminals connected together, the effect of variations in the output current, and ensuing distortion, can be greatly reduced.

The proposed transconductor is especially useful for low-voltage continuous-time filters. The transconductor of FIG. 1 realizes the voltage-to-current conversion. In order to realize a double-input stage, two single-input stages would conventionally be connected at their output node, i.e. at the collector of the bipolar transistor Q shown in FIG. 1. However, in the circuit of FIG. 1, the major cause of distortion is the dependance of VDS on the variation of VBE in the bipolar transistor. The composition of two stages like that of FIG. 1 does not reduce this nonlinearity.

In the innovative scheme of FIG. 2, the summation of the two input currents is performed earlier, namely at the emitter of a single bipolar transistor. If the two inputs are exactly in phase, the peak current across the bipolar will simply be the sum of the peak currents due to the separate inputs; but if the two inputs are not in phase, then the average signal current across the bipolar will be reduced accordingly. This reduction follows from the well-known inequality $|\Sigma i_k| \leq \Sigma |i_k|$. (The quiescent current across the bipolar will merely be the sum of the quiescent currents across the MOS devices.) The percentage of modulation of the emitter current will therefore be reduced, which implies a reduced varation in VBE, and hence a reduced variation in VDS, and hence a reduction in distortion.

This solution is specially effective where the signal voltages to the two inputs are approximately equal in modulo and offset in phase by a large amount (e.g. 90–180 degrees). Understandably, best performance would be achieved with input transistors which are as far as possible identical.

BRIEF DESCRIPTION OF THE DRAWING

The disclosed inventions will be described with reference to the accompanying drawings, which show important sample embodiments of the invention and which are incorporated in the specification hereof by reference, wherein.

The invention can be more clearly understood by having reference to the following description, to be read in conjunction with the accompanying drawings, in which.

DETAILED DESCRIPTION OF THE PREFERRED EMBODIMENTS

Figure 2:
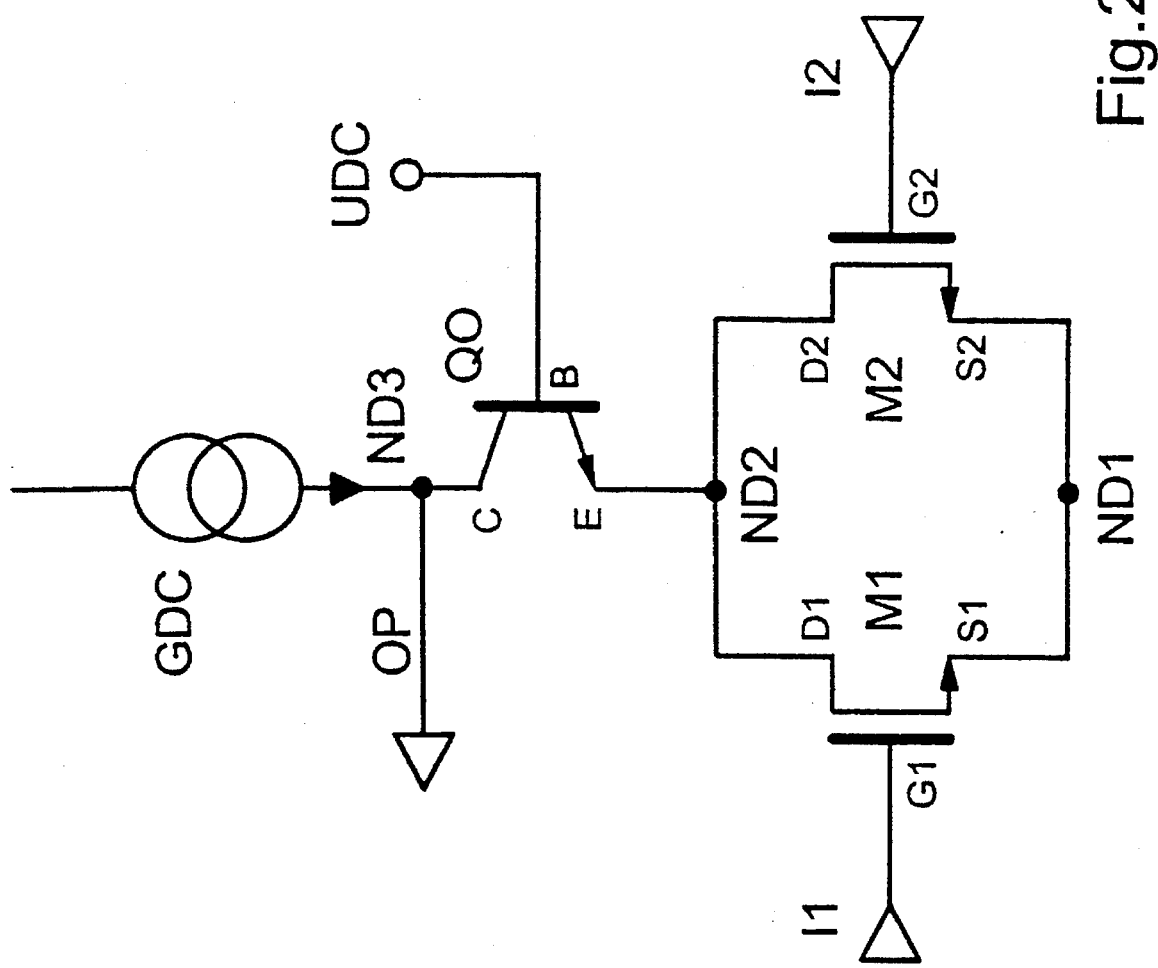
FIG. 2 is a circuit diagram of a transconductor circuit according to the invention.
Figure 1:
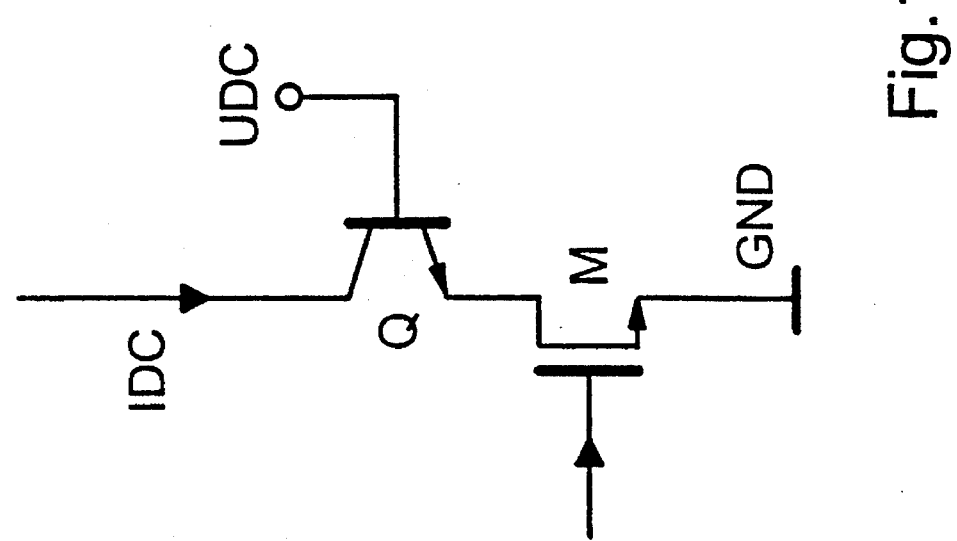
FIG. 1 is a circuit diagram of a conventional transconductor circuit.

The numerous innovative teachings of the present application will be described with particular reference to the presently preferred embodiment (by way of example, and not of limitation), in which:

The transconductor circuit of this invention, shown in FIG. 2, has a double input on first I1 and second I2 input terminals and a single output on an output terminal OP; it comprises a first input transistor MI of the MOS type and a second input transistor M2, also of the MOS type, which have their gate terminals, G1 and G2, respectively connected to the input terminals I1 and I2, source terminals 1 and 2 connected together and to a first node ND1, and drain terminals D1 and D2 connected together and to a second node ND2; it further comprises a third transistor QO of the BJT type which has its emitter terminal E connected to the node ND2, base terminal B connected to a reference bias potential UDC, and collector terminal C connected to a third node ND3. In addition, a bias current generator GDC is connected to the node ND3, with the output terminal OP being also connected to the node ND3.

The potential at the node ND2 can be controlled through the transistor QO.

With the above assumption, and neglecting the bias signals, it is easily seen that the signal current being flowed through the transistor QO will be small, so that small will also be variations caused by the base-to-emitter voltage VBE. In fact, this current is given by the signal voltage on the input I1 multiplied by the transconductance of the transistor M1 plus the signal voltage on the input I2 multiplied by the transconductance of the transistor M2.

The node ND2 potential is, therefore, quite constant, and the drain-to-source voltage VDS of the transistors M1, M2 and, hence, the transconductance variations, will be limited. This results in distortion being low.

The circuit shown in FIG. 2 lends itself to several modifications, among which are the transistors M1, M2 and QO, which may either be of the MOS type or the BJT type.

The node ND 1 is usually held at a predetermined fixed potential, often at ground potential. The node ND 1 could be connected, however, to another bias current generator.

The assumption made (signal voltages to the inputs approximately equal in modulo and offset by about 180 degrees) is frequently met in actual practice.

Figure 3A:
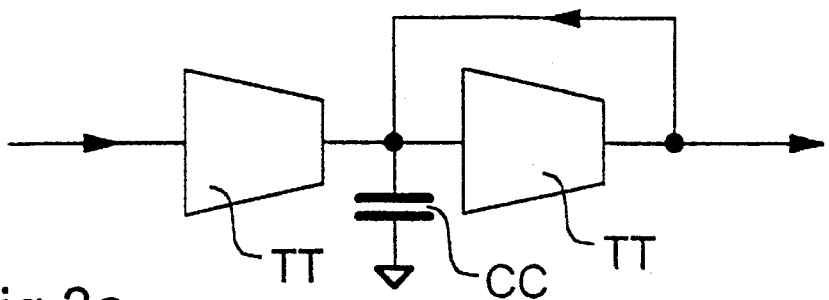
FIGS. 3a and 4a show, in block diagram form, conventional active filters.

A conventional active filter of the first order is shown in Figure 3a to comprise two transconductor circuits TT of a traditional type connected in series. The center tap of that link is connected to ground through a capacitor CC and to directly to the filter output, thereby forming a feedback path.

Figure 3B:
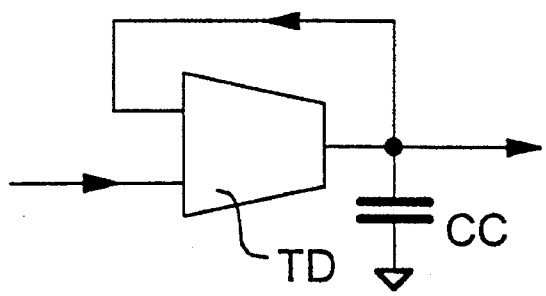
FIGS. 3b and 4b show, also in block diagram form, active filters according to the invention which correspond to those illustrated in the respective Figures "a".

A similar type of circuit, but implemented with a transconductor TD according to this invention, is shown in FIG. 3b. The transconductor TD has a first input connected to the filter input, and a second input connected to the output of the transconductor TD; this output is connected to ground through a capacitor CC and to the filter output by a direct link.

The circuit of FIG. 3b illustrates that the assumption has been met, as a first approximation, at least at frequencies below the circuit cutoff frequency.

This circuit provides a transconductance building block having two inputs and having low distortion to be used in filters; the performance of the filter of FIG. 3b is the one of an inverting buffer having low distortion for signals having a bandwidth well below the pole given by the capacitor CC.

Figure 4A:
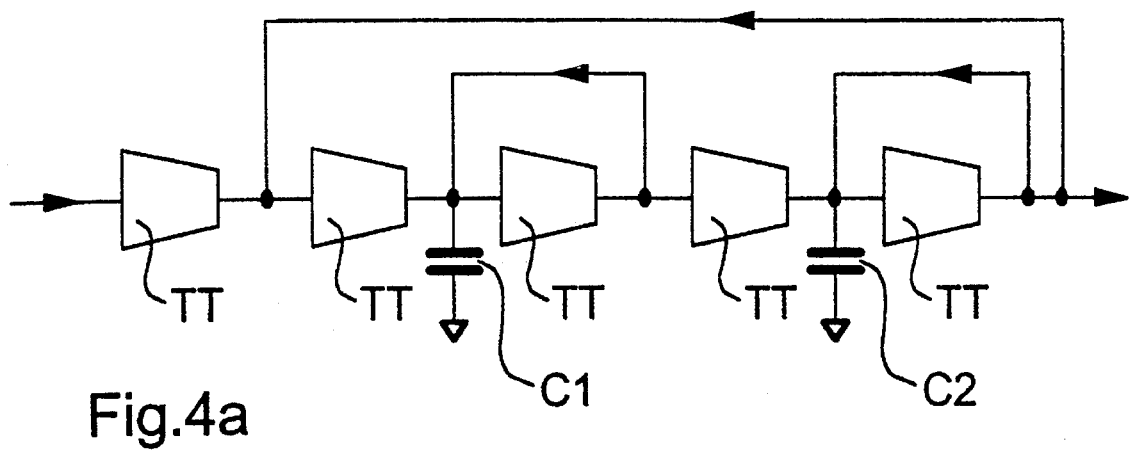

FIG. 4a shows an active filter of the second order implemented with transconductors TT of conventional design, a first capacitor C1 and a second capacitor C2. It is essentially the equivalent of having two filters of the first order, similar to the one shown in FIG. 3a, feedback cascade connected.

Figure 4B:
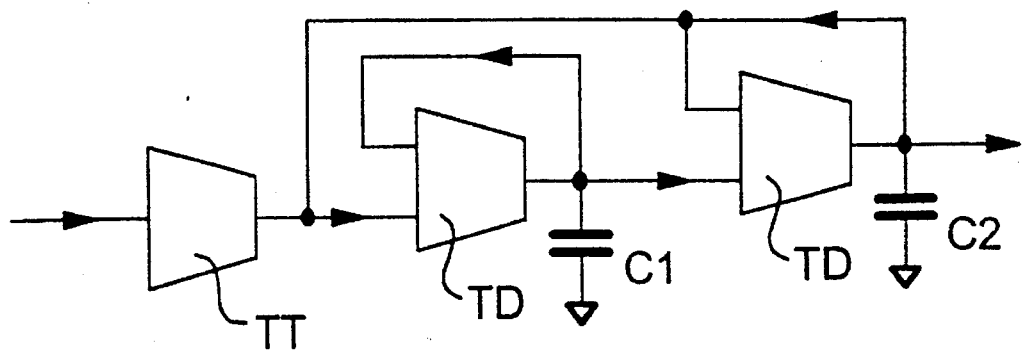

FIG. 4b shows the same type of filter of the second order as implemented with transconductors TD according to the invention. This corresponds essentially to having two filters of the first order like that shown in FIG. 4a cascade connected and fed back.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A transconductor circuit comprising:
   a pair of field effect transistors connected in parallel, and each connected to receive a respective input signal on a gate terminal thereof; and
   a bipolar transistor, having
      a base terminal thereof connected to a constant voltage, and
      a first current-carrying terminal thereof connected to be driven by the parallel combination of said field-effect transistors, and
      a second current-carrying terminal thereof connected to be driven by a current generator and connected to provide an output;
   whereby said bipolar transistor provides a reduced noise contribution when said respective input signals are at least partially out of phase.

2. A transconductor circuit with first and second input terminals and a single output on an output terminal, being of the type which comprises first and second input transistors having gating terminals respectively connected to said input terminals, and two first homolog terminals connected together and to a first node, and a bias current generator connected to two second homolog terminals of said transistors, characterized in that said two second terminals are connected together and to a second node, and in that it comprises a third node connected to said output terminal and said current generator, and a third transistor having primary conduction terminals respectively connected to said second and third nodes, and a gating terminal connected to a reference bias potential, thereby controlling the potential at said second node.

3. A circuit according to claim 2, characterized in that said first and second transistors are of the MOS type.

4. A circuit according to claim 2 characterized in that said third transistor is of the BJT type.

5. A circuit according to claim 2 characterized in that said first node has a predetermined fixed potential.

6. A circuit according to claim 2 characterized in that it comprises an additional bias current generator connected to said first node.

7. An active filter circuit comprising:
   a plurality of filter active elements interconnected in a filter network to provide a desired transfer function between an input terminal and an output terminal, at least one said filter active element including a transconductor circuit comprising:
   a pair of field effect transistors connected in parallel, and each connected to receive a respective input signal on a gate terminal thereof; and
   a bipolar transistor, having
      a base terminal thereof connected to a constant voltage, and
      a first current-carrying terminal thereof connected to be driven by the parallel combination of said field-effect transistors, and
      a second current-carrying terminal thereof connected to be driven by a current generator and connected to provide an output;
   whereby said bipolar transistor provides a reduced noise contribution when said respective input signals are at least partially out of phase.

8. A filter circuit according to claim 7, comprising at least one capacitor with one terminal connected to a reference potential and the other terminal connected to said output terminal of said circuit, and wherein said input terminal of said circuit is connected to said output terminal of said circuit to form a feedback circuit.

9. The circuit of claim 1, wherein said field-effect transistors are N-channel insulated-gate field-effect transistors.

10. The circuit of claim 2, wherein said field-effect transistors are N-channel insulated-gate field-effect transistors.

11. The circuit of claim 7, wherein said field-effect transistors are N-channel insulated-gate field-effect transistors.

12. The circuit of claim 8, wherein said bipolar transistor is an NPN bipolar transistor.

13. The circuit of claim 7, wherein said bipolar transistor is an NPN bipolar transistor.

14. A transconductor circuit comprising:
   a pair of field effect transistors connected in parallel, and each connected to receive a respective input signal on a gate terminal thereof;
   a current generator; and
   an additional transistor having a control terminal thereof connected to a reference potential, and having current-carrying terminals connected in series with said pair of field-effect transistors and with said current generator;
   said current generator being connected to said additional transistor to provide an output signal;
   whereby said additional transistor provides a reduced noise contribution when said respective input signals are at least partially out of phase.

15. The circuit of claim 14, wherein said field-effect transistors are N-channel insulated-gate field-effect transistors.

16. The circuit of claim 14, wherein said additional transistor is an NPN bipolar transistor.

17. A transconductor circuit, comprising:
   a pair of field effect transistors connected in parallel, and each connected to receive a respective input signal on a gate terminal thereof;
   a current generator; and
   an additional transistor which is bipolar, and has a base terminal thereof connected to a reference potential, and has emitter and collector connected in series with said pair of field-effect transistors and with said current generator;
   said current generator being connected to said additional transistor to provide an output signal;
   whereby said additional transistor provides a reduced noise contribution when said respective input signals are at least partially out of phase.

18. The circuit of claim 17, wherein said field-effect transistors are N-channel insulated-gate field-effect transistors.

19. The circuit of claim 17, wherein said additional transistor is an NPN bipolar transistor.

20. A continuous-time filter circuit, comprising:
   a plurality of filter active elements interconnected in a filter network to provide a desired transfer function between an input terminal and an output terminal, at least one said filter active element including a transconductor circuit comprising:
   a pair of field effect transistors connected in parallel, and each connected to receive a respective input signal on a gate terminal thereof;
   a current generator; and
   an additional transistor having a control terminal thereof connected to a reference potential, and having current-carrying terminals connected in series with said pair of field-effect transistors and with said current generator;

said current generator being connected to said additional transistor to provide an output signal;

whereby said additional transistor provides a reduced noise contribution when said respective input signals are at least partially out of phase.

21. The circuit of claim 20, wherein said field-effect transistors are N-channel insulated-gate field-effect transistors.

22. The circuit of claim 20, wherein said additional transistor is an NPN bipolar transistor.

23. A method of performing a transconductor function, comprising the steps of:

(a.) receiving a pair of input signals on the gates of a pair of field-effect transistors which have first current-carrying terminals thereof connected together, and which also have second current-carrying terminals thereof connected together;

(b.) regulating the voltage of said first current-carrying terminals using an additional transistor which is connected to form a series combination with said pair of field-effect transistors, and which has a control terminal thereof connected to a reference potential; and (c.) providing current, using a current generator, both to the series combination of said additional transistor with said pair of field-effect transistors, and also to an output terminal.

24. The method of claim 23, wherein said field-effect transistors are N-channel insulated-gate field-effect transistors.

25. The method of claim 23, wherein said additional transistor is an NPN bipolar transistor.

26. A method of performing a continuous-time filter function, comprising the steps of:

providing an input signal to an input terminal of a plurality of filter active elements interconnected in a filter network to provide a desired transfer function between said input terminal and an output terminal, at least one said filter active element performing a transconductor function by using the steps of:

(a.) receiving a pair of input signals on the gates of a pair of field-effect transistors which have first current-carrying terminals thereof connected together, and which also have second current-carrying terminals thereof connected together;

(b.) regulating the voltage of said first current-carrying terminals using an additional transistor which is connected to form a series combination with said pair of field-effect transistors, and which has a control terminal thereof connected to a reference potential; and (c.) providing current, using a current generator, both to the series combination of said additional transistor with said pair of field-effect transistors, and also to an output terminal.

27. The method of claim 26, wherein said field-effect transistors are N-channel insulated-gate field-effect transistors.

28. The method of claim 26, wherein said additional transistor is an NPN bipolar transistor.

\* \* \* \* \*